United States Patent
Yin et al.

(10) Patent No.: US 9,190,572 B2
(45) Date of Patent: Nov. 17, 2015

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Lingfeng Yin, Xiamen (CN); Suhui Lin, Xiamen (CN); Jiansen Zheng, Xiamen (CN); Lingyuan Hong, Xiamen (CN); Chuangui Liu, Xiamen (CN); Yide Ou, Xiamen (CN); Gong Chen, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/718,026

(22) Filed: May 20, 2015

(65) Prior Publication Data

US 2015/0255682 A1 Sep. 10, 2015

Related U.S. Application Data

(63) Continuation of application No. PCT/CN2013/088280, filed on Dec. 2, 2013.

(30) Foreign Application Priority Data

Dec. 21, 2012 (CN) .......................... 2012 1 0558990

(51) Int. Cl.
*H01L 33/42* (2010.01)
*C23C 14/35* (2006.01)
*H01L 33/38* (2010.01)
*H01L 33/00* (2010.01)
*C23C 14/58* (2006.01)
*C23C 14/02* (2006.01)

(52) U.S. Cl.
CPC .............. *H01L 33/42* (2013.01); *C23C 14/024* (2013.01); *C23C 14/35* (2013.01); *C23C 14/58* (2013.01); *H01L 33/005* (2013.01); *H01L 33/38* (2013.01); *H01L 2933/0016* (2013.01); *H01L 2933/0025* (2013.01); *H01L 2933/0066* (2013.01)

(58) Field of Classification Search
None
See application file for complete search history.

(56) References Cited

U.S. PATENT DOCUMENTS

2004/0206961 A1* 10/2004 Yamada .................. H01L 33/14 257/79
2011/0089444 A1* 4/2011 Yao .......................... F21K 9/00 257/93

FOREIGN PATENT DOCUMENTS

JP 2005235798 A1 9/2005

*Primary Examiner* — William Coleman
*Assistant Examiner* — Kien Ly
(74) *Attorney, Agent, or Firm* — Syncoda LLC; Feng Ma

(57) ABSTRACT

A light emitting diode includes: a substrate; a light-emitting epitaxial layer, from bottom to up, laminated by semiconductor material layers of a first confinement layer, a light-emitting layer and a second confinement layer over the substrate; a current blocking layer over partial region of the light-emitting epitaxial layer; a transparent conducting structure over the current blocking layer that extends to the light-emitting epitaxial layer surface and is divided into a light-emitting region and a non-light-emitting region, in which, the non-light-emitting region corresponds to the current blocking layer with thickness larger than that of the light-emitting region, thus forming a good ohmic contact between this structure and the light-emitting epitaxial layer and reducing light absorption; and a P electrode over the non-light-emitting region of the transparent conducting structure, which guarantees current spreading performance and reduces working voltage and light absorption.

13 Claims, 12 Drawing Sheets

LIGHT EMITTING DIODE AND FABRICATION METHOD THEREOF

CROSS-REFERENCE TO RELATED APPLICATIONS

The present application is a continuation of, and claims priority to, PCT/CN2013/088280 filed on Dec. 2, 2013, which claims priority to Chinese Patent Application No. 201210558990.1 filed on Dec. 21, 2012. The disclosures of these applications are hereby incorporated by reference in their entirety.

BACKGROUND

After years of development, the light emitting diode has been widely applied in different fields like display, indication, back light and lighting. III-V group compound is the mainstream semi-conductor material for fabricating light emitting diode, in which, GaN-based material and AlGaInP-based material are most popular. Since the conventional P-type III-V group semiconductor material has poor current spreading performance, to enable even injection of current into the light-emitting layer, a transparent conducting layer is added over the p-type material layer. Among many materials as transparent conducting layer to improve current spreading effects like ITO, CTO, InO and ZnO, the ITO (Indium Tin Oxide) is most widely applied. The ITO film refers to indium tin oxide semiconductor transparent conducting film, and the ITO meets two index requirements, namely low resistivity and high light transmittance. In comparison to other transparent semiconductor conducting films, ITO has good chemical stability and heat stability.

Today, evaporation-deposited ITO tends to be replaced by sputtered ITO which has excellent performance and such advantages as voltage reduction and luminance improvement. However, the sputtered ITO has smooth surface that leads to a poor adhesiveness to the metal electrode. In particular, when above 250° C., thermal expansivity difference between the ITO and the metal electrode material gets larger, making stress between films increase accordingly, thus greatly reducing electrode adhesiveness.

In industry, main methods to solve such electrode dropping include roughening ITO film or adjusting film process parameters. These technologies, however, are still not perfect and have their own deflects. For example, the sputtered ITO microstructure generally comprises 30 nm-100 nm grains while wet roughening with solution is isotropic for each grain etching, therefore, the roughed surface remains flat. And adjustment of film process parameters, like sectional coating or reduction of rate in general, is difficult for it has to consider photoelectric parameter and electrode adhesiveness at the same time.

SUMMARY

The present disclosure provides a light emitting diode with transparent conducting layers and fabrication method thereof, which guarantees current spreading performance and reduces working voltage and light absorption.

According to a first aspect of the present disclosure, a light emitting diode, comprising: a substrate; a light-emitting epitaxial layer, from bottom to up, laminated by semiconductor material layers of a first confinement layer, a light-emitting layer and a second confinement layer over the substrate; a current blocking layer over partial region of the light-emitting epitaxial layer; a transparent conducting structure over the current blocking layer that extends to the light-emitting epitaxial layer surface and is divided into a light-emitting region and a non-light-emitting region, in which, the non-light-emitting region corresponds to the current blocking layer with thickness larger than that of the light-emitting region, thus forming a good ohmic contact between this structure and the light-emitting epitaxial layer and reducing light absorption; and a P electrode over the non-light-emitting region of the transparent conducting structure.

Further, the transparent conducting structure comprises: a first transparent conducting layer, with a pattern corresponding to that of the current blocking layer, formed over the current blocking layer; and a second transparent conducting layer that clads over the first transparent conducting layer and the current blocking layer and extends to the light-emitting epitaxial layer surface, in which, the lower surface area of the second transparent conducting layer is larger than the upper surface area of the current blocking layer.

Further, the contact surface between the second transparent conducting layer and the P electrode is a rough surface.

Further, the first transparent conducting layer is about 300-5000 Å thick.

Further, the second transparent conducting layer is about 300-5000 Å thick.

Further, the first transparent conducting layer or the second transparent conducting layer is made of any one of ITO, ZnO, CTO, InO, In-doped ZnO, Al-doped ZnO or Ga-doped ZnO.

Further, material of the second transparent conducting layer is similar to that of the first transparent conducting layer.

According to a second aspect of the present disclosure, a fabrication method of light emitting diode, comprising: 1) providing a substrate, over which, forming a light-emitting epitaxial layer through epitaxial growth, deposited with a first confinement layer, a light-emitting layer and a second confinement layer from bottom to up; 2) forming a current blocking layer over partial region of the light-emitting epitaxial layer; 3) fabricating a transparent conducting structure over the current blocking layer and extending to the light-emitting epitaxial layer surface, in which, the non-light-emitting region is the region that corresponds to the current blocking layer and the light-emitting region is the one that directly contacts with the light-emitting epitaxial layer, and thickness of the non-light-emitting region is larger than that of the light-emitting region, thus forming a good ohmic contact between this structure and the light-emitting epitaxial layer and reducing light absorption; and 4) fabricating a P electrode over the non-light-emitting region of the transparent conducting structure.

Further, Step 3) comprises: forming a first transparent conducting layer over the current blocking layer; forming a second transparent conducting layer over the first transparent conducting layer and extending to the light-emitting epitaxial layer surface, thus forming a transparent conducting structure, in which, the non-light-emitting region comprises a first and a second transparent conducting layer and the light-emitting region does not comprise the first transparent conducting layer.

Further, in Step 3, form the first transparent conducting layer with evaporating deposition and form the second transparent conducting layer with magnetron sputtering, thus forming a rough structure over the contact surface between the second transparent conducting layer and the P electrode.

Further, in Step 3, form the first transparent conducting layer with magnetron sputtering and form the second transparent conducting layer with evaporating deposition, thus forming a rough structure over the contact surface between the second transparent conducting layer and the P electrode.

In the transparent conducting structure of present disclosure, thickness of the corresponding region below the P electrode is larger than those of other regions, thus forming a good ohmic contact between the transparent conducting layer and the light-emitting epitaxial layer, reducing light absorption, effectively reducing LED chip voltage and improving light-emitting efficiency. Further, right below the P electrode is a multi-layer transparent conducting layer structure and other regions are single-layer transparent conducting structures, in which, in the multi-layer transparent conducting layer structure, at least one layer adopts evaporating coating which only requires certain roughness without special adjustment of coating parameters, thus maximizing stress release between film layers and guaranteeing adhesiveness of the dual-layer transparent conducting layer and the metal electrode.

DETAILED DESCRIPTION

Embodiment 1

Figure 6:
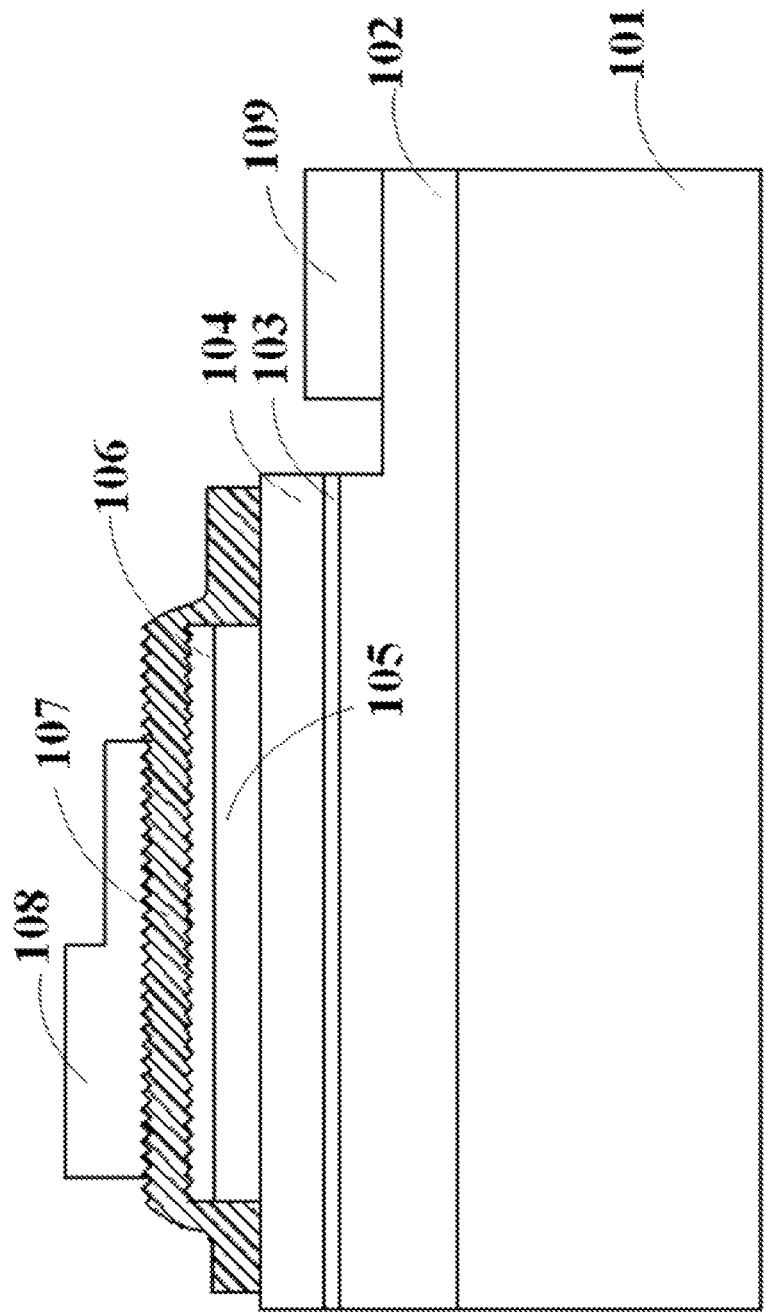
FIG. 6 illustrates a sixth step.

As shown in FIG. 6, a light emitting diode device with transparent conducting layers, comprising: a substrate 101; a light-emitting epitaxial layer, laminated by semiconductor material layers of a first confinement layer 102, a light-emitting layer 103 and a second confinement layer 104 from bottom to up over the substrate 101; a current blocking layer 105 over partial region of the second confinement layer 104 of the light-emitting epitaxial layer; a first transparent conducting layer 106 over the current blocking layer 105, in which, the contact area between the first transparent conducting layer 106 and the current blocking layer 105 equals to the upper surface area of the current blocking layer 105; a second transparent conducting layer 107 that clads over the first transparent conducting layer 106 and the current blocking layer 105 and extends to the second confinement layer 104 over the light-emitting epitaxial layer surface, in which, the lower surface area of the second transparent conducting layer 107 is larger than the upper surface area of the current blocking layer 105; a P electrode 108 over the second transparent conducting layer 107 with a rough region; and an N electrode 109 over the exposed second confinement layer 104.

In this device structure, only above the current blocking layer 105 has a dual-layer transparent conducting layer structure, and the dual-layer transparent conducting layer is only located under the P electrode 108, while most regions above the light-emitting epitaxial layer are single-layer transparent conducting layers, thus guaranteeing current spreading performance, reducing LED chip voltage and preventing forming a large-area and thick transparent conducting layer that may cause more light absorption and less light effect.

Figure 1:
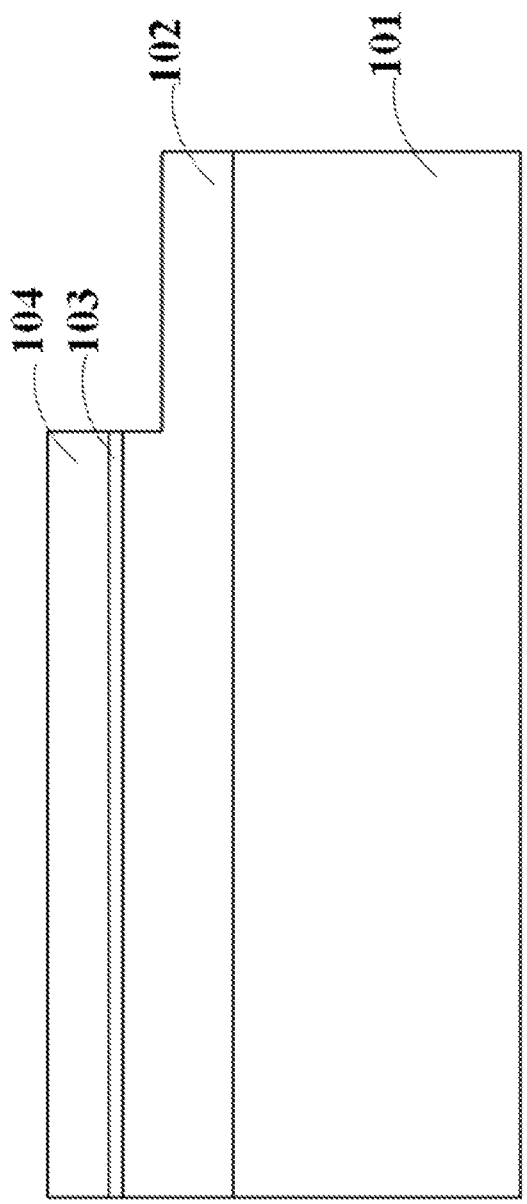
FIG. 1 illustrates a first step in a fabrication process of a light emitting diode chip with an alternating adhesive layer electrode according to some embodiments.

A detailed description will be given to the above structure in combination with fabrication methods. The fabrication method of the light emitting diode with transparent conducting layers, comprising:

As shown in FIG. 1, provide a sapphire substrate 101, and it is to be understood that the substrate can be any one of silicon carbide substrate, silicon substrate, gallium nitride substrate or zinc oxide substrate; grow a first confinement layer (N-type semiconductor layer) 102, a light-emitting layer 103 and a second confinement layer (P-type semiconductor layer) 104 via MOCVD over the sapphire substrate 101 in successive, thus forming a light-emitting epitaxial layer; and etch part of the light-emitting epitaxial layer via processes like yellow-light photo masking or dry etching to expose part of the second confinement layer (P-type semiconductor layer) 104.

Figure 2:
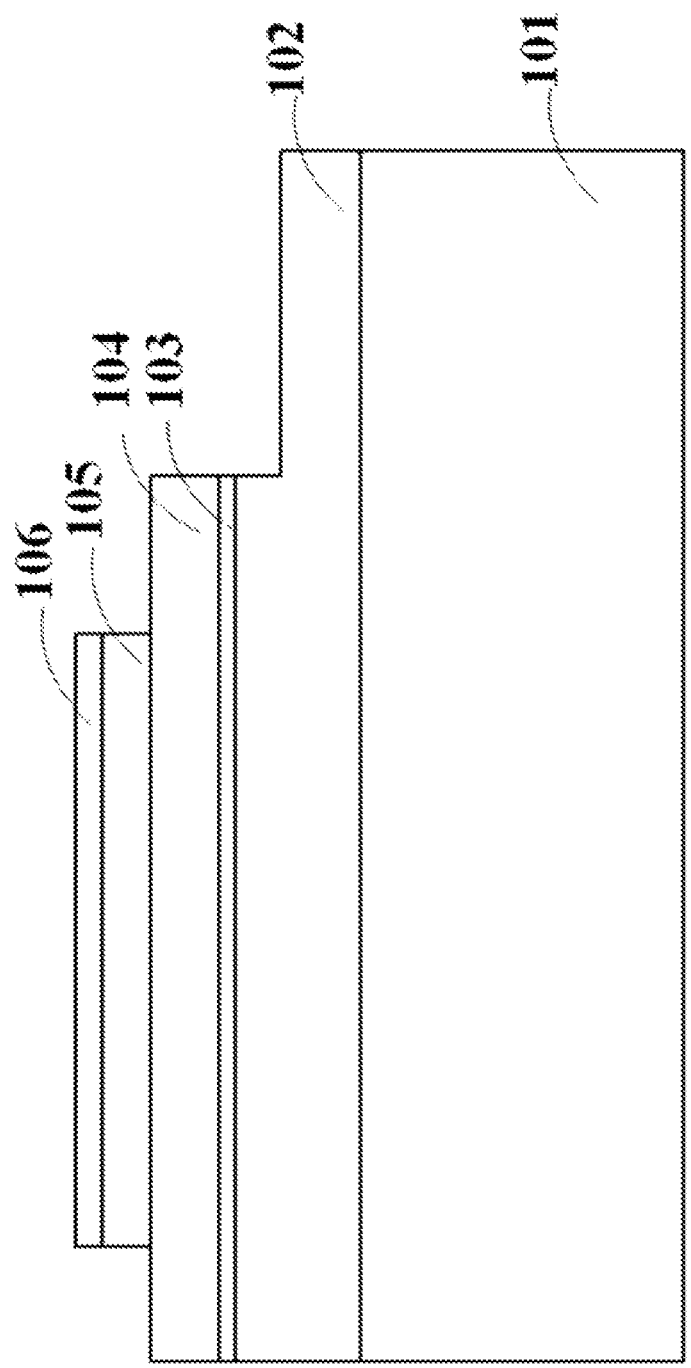
FIG. 2 illustrates a second step.
Figure 3:
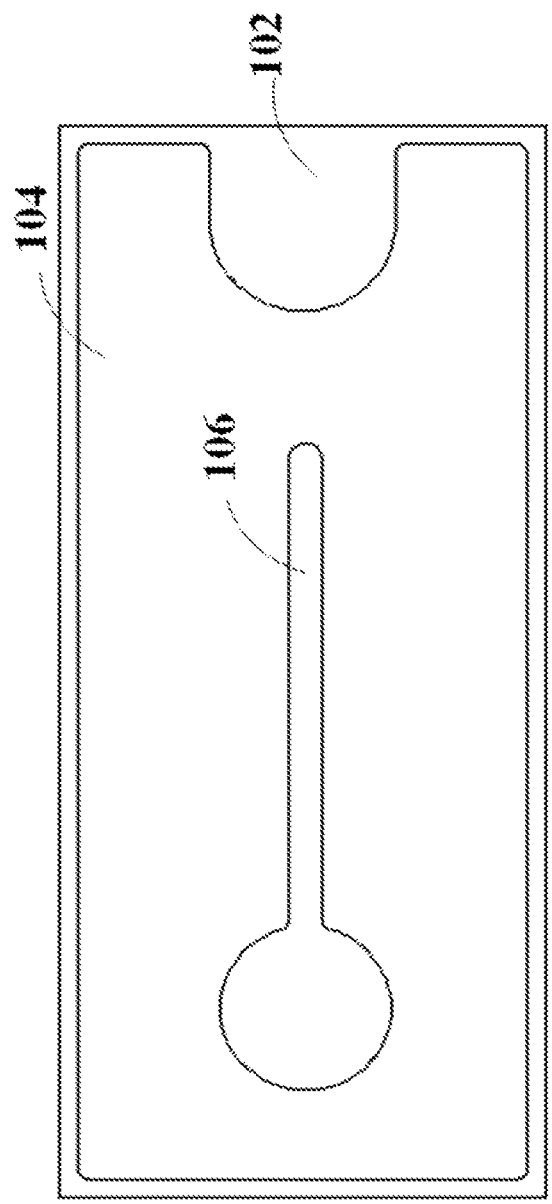
FIG. 3 illustrates a third step.

As shown in FIGS. 2 and 3, deposit a current blocking layer 105 over the light-emitting epitaxial layer via chemical vapor deposition (CVD) or physical vapor deposition (PVD), in which, the current blocking layer 105 can be made of any one or combination of silicon dioxide ($SiO_2$), silicon nitride ($Si_3N_4$) or aluminum oxide ($Al_2O_3$); deposit a first ITO transparent conducting layer 106 about 300-5000 Å thick over the current blocking layer 105 via evaporating deposition. It is to be understood that the first transparent conducting layer 106 can be made of any one of ZnO, CTO, InO, In-doped ZnO, Al-doped ZnO or Ga-doped ZnO. Obtain preset patterns over the deposited current blocking layer 105 and the first transparent conducting layer 106 via same yellow-light photo masking, wet etching, lifting-off, etc.

Figure 4:
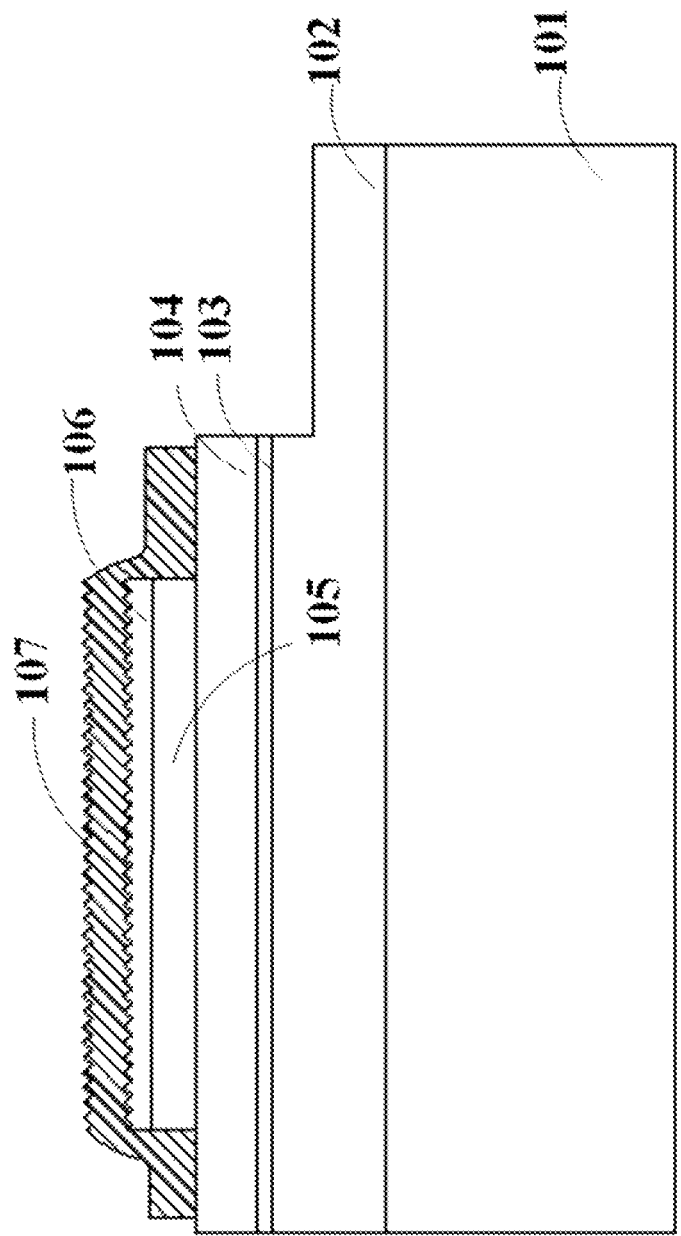
FIG. 4 illustrates a fourth step.
Figure 5:
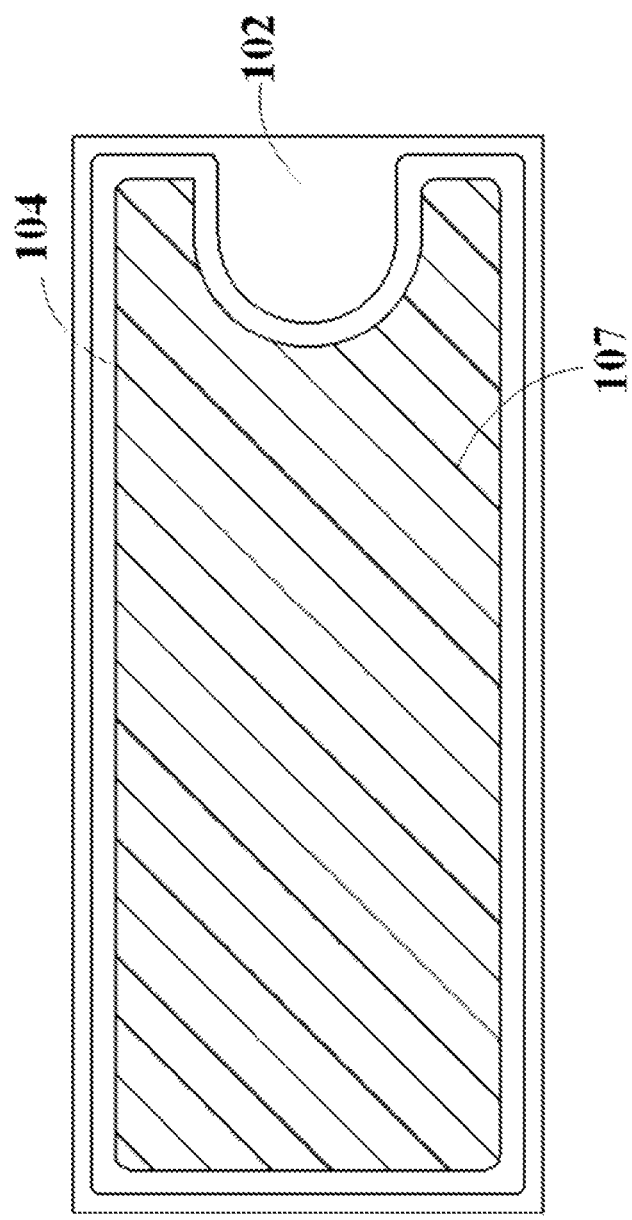
FIG. 5 illustrates a fifth step.

As shown in FIGS. 4 and 5, form a second ITO transparent conducting layer 107 about 300-5000 Å thick over the first ITO transparent conducting layer 106 via magnetron sputtering. The first transparent conducting layer 106 obtained from evaporating deposition has a rough upper surface. For the second transparent conducting layer 107 obtained from magnetron sputtering, only part of regions (i.e., the second transparent conducting layer in the non-light-emitting region) cladded over the first transparent conducting layer 106 is rough and the remaining region (i.e., the second transparent conducting layer in the light-emitting region) cladded over the second confinement layer 104 is smooth. The second transparent conducting layer 107 with a rough upper surface is right below the P electrode and has a direct contact with the P electrode, thus increasing adhesiveness of the electrode to the semi-conductor layer and improving reliability of the light emitting diode. The single-layer second transparent conducting layer with a smooth upper surface is over the epitaxial layer, thus guaranteeing current spreading performance, reducing LED chip voltage and preventing forming a large-area and thick transparent conducting layer that may cause more light absorption and light loss; however, it is to be understood that the second transparent conducting layer 107 can be made of any one of ZnO, CTO, InO, In-doped ZnO, Al-doped ZnO or Ga-doped ZnO.

As shown in FIG. 6, take annealing heat treatment at 200-400° C.; form a P electrode 108 over the second transparent conducting layer 107 via evaporating or sputtering; form an N electrode 109 over the exposed second confinement layer 104 via evaporating or sputtering, in which, the P electrode 108 and the N electrode 109 can be formed via same yellow-light photo masking or lifting-off to complete fabrication of a light emitting diode with dual-layer transparent conducting layer.

Embodiment 2

Figure 12:
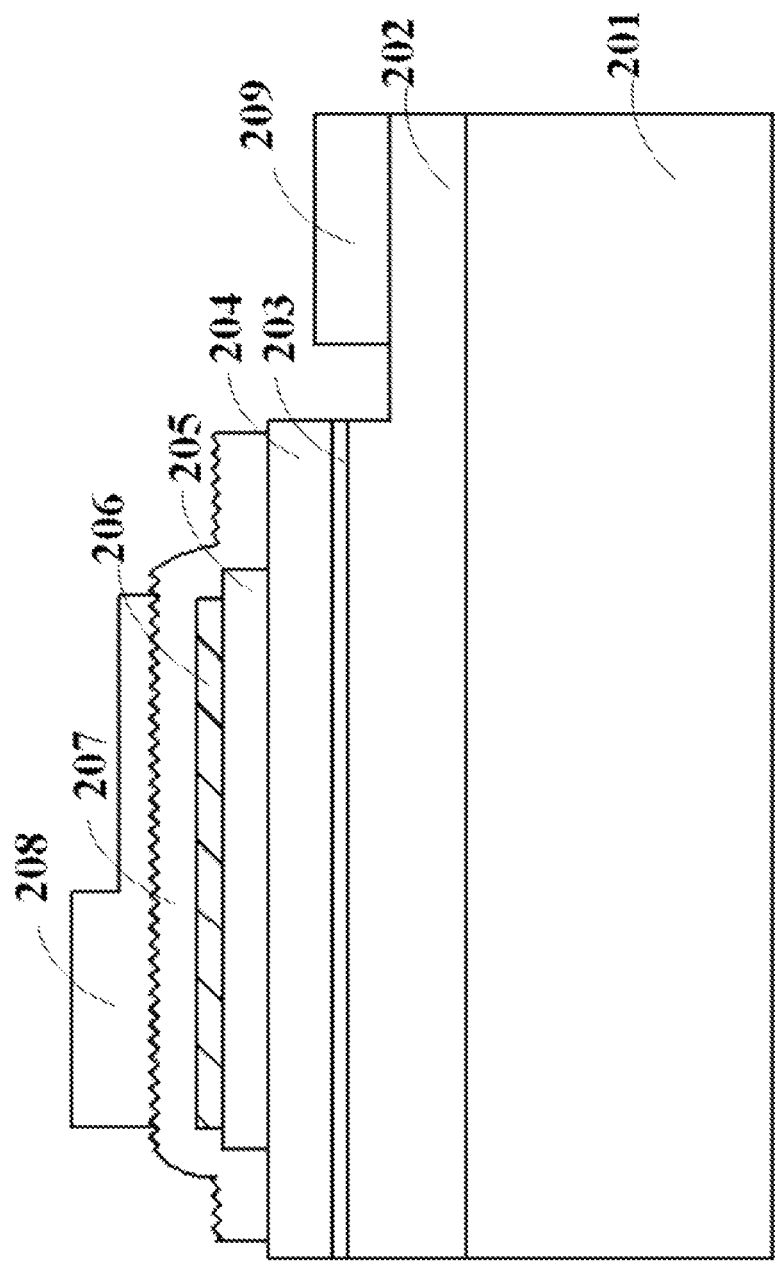
FIG. 12 illustrates a sixth step.
In the drawings:
101, 201: substrate; 102, 202: first confinement layer; 103, 203: light-emitting layer; 104, 204: second confinement layer; 105, 205: current blocking layer; 106, 206: first transparent conducting layer; 107, 207: second transparent conducting layer; 108, 208: P electrode; 109, 209: N electrode.

As shown in FIG. 12, another light emitting diode device with transparent conducting layers that is basically similar to the one disclosed in Embodiment 1 in structure, and main differences lie in that: in this embodiment, contact area of the first transparent conducting layer 206 and the current blocking layer 205 is less than the upper surface area of the current blocking layer 205 and the first transparent conducting layer 206 has no rough upper surface.

Figure 7:
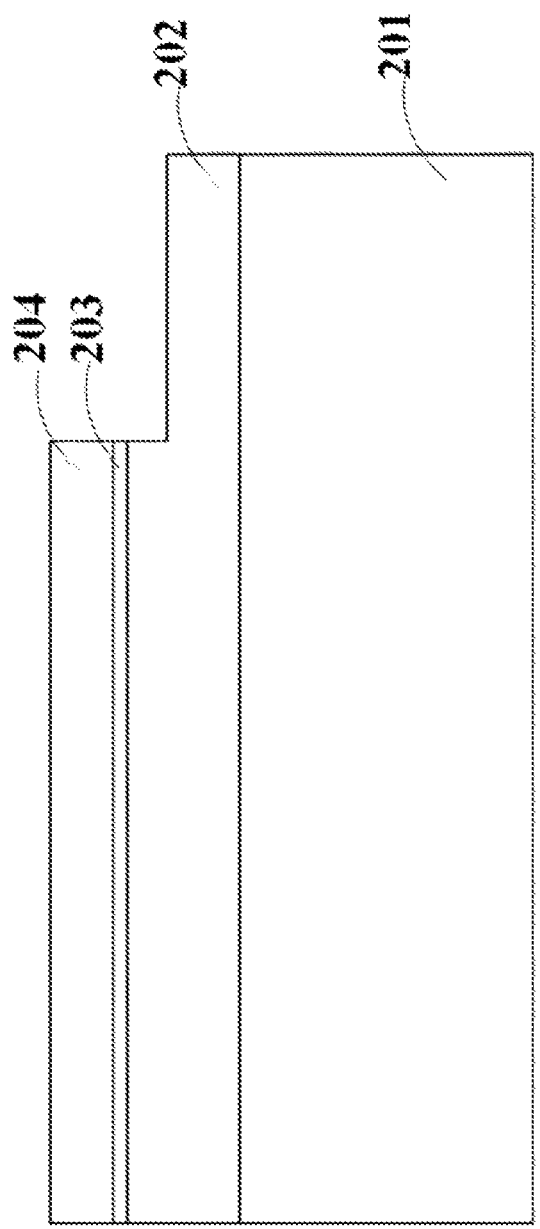
FIG. 7 illustrates a first step in a fabrication process of a light emitting diode chip with an alternating adhesive layer electrode according to some other embodiments.

As shown in FIGS. 7-12, another fabrication method of a light emitting diode device with transparent conducting layers that is basically similar to the one disclosed in Embodiment 1, and the main difference lies in that the coating methods for the first transparent conducting layer 206 and the second transparent conducting layer 207 are different. Specifically:

As shown in FIG. 7, provide a sapphire substrate 201; grow a first confinement layer (N-type semiconductor layer) 202, a light-emitting layer 203 and a second confinement layer (P-type semiconductor layer) 204 via MOCVD over the sapphire substrate 201 in successive, thus forming a light-emitting epitaxial layer; and etch part of the light-emitting epitaxial layer via processes like yellow-light photo masking or dry etching to expose part of the second confinement layer (P-type semiconductor layer) 204.

Figure 8:
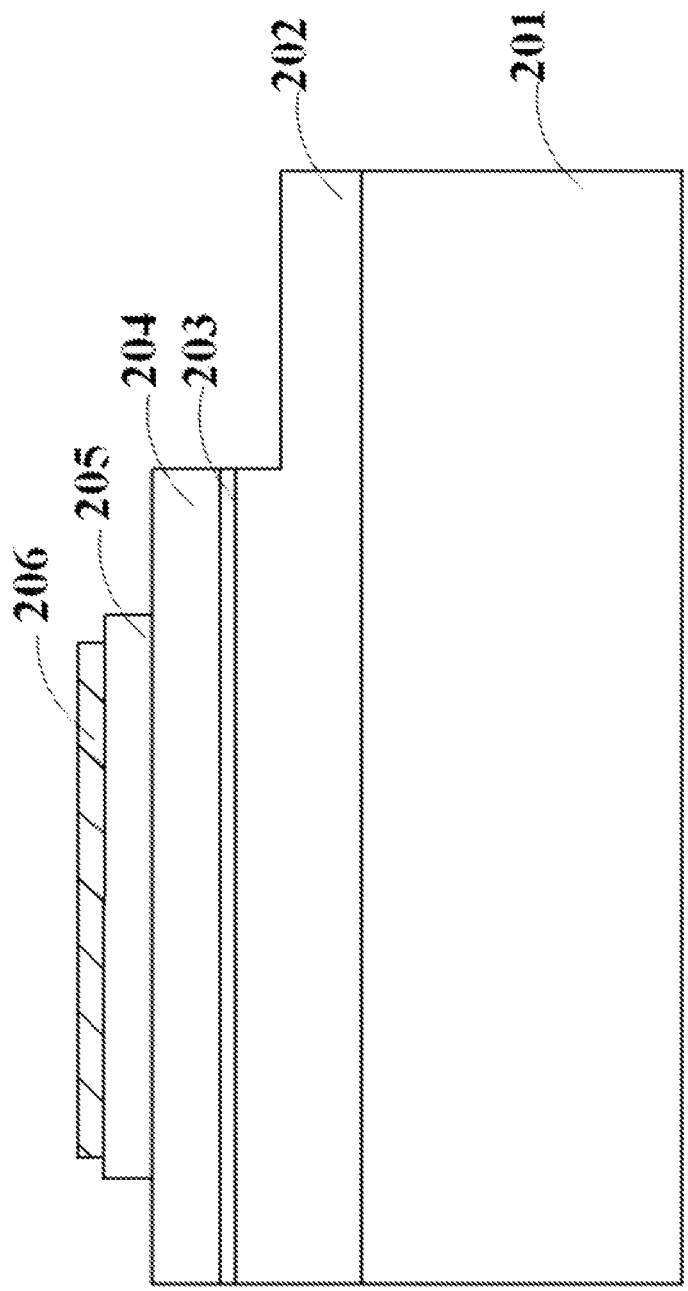
FIG. 8 illustrates a second step.
Figure 9:
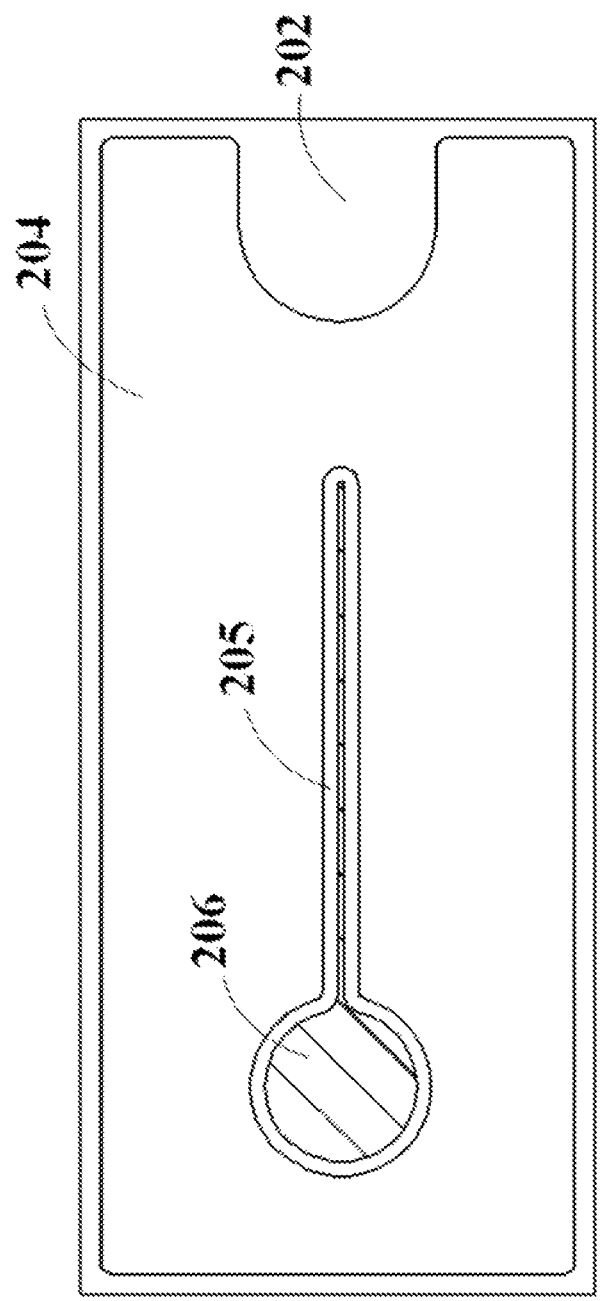
FIG. 9 illustrates a third step.

As shown in FIGS. 8 and 9, deposit a current blocking layer 205 over the light-emitting epitaxial layer via CVD; deposit a first ITO transparent conducting layer 206 about 300-5000 Å thick over the current blocking layer 205 via magnetron sputtering; and obtain preset patterns over the deposited current blocking layer 205 and the first transparent conducting layer 206 via same yellow-light photo masking, wet etching, lifting-off, etc.

Figure 10:
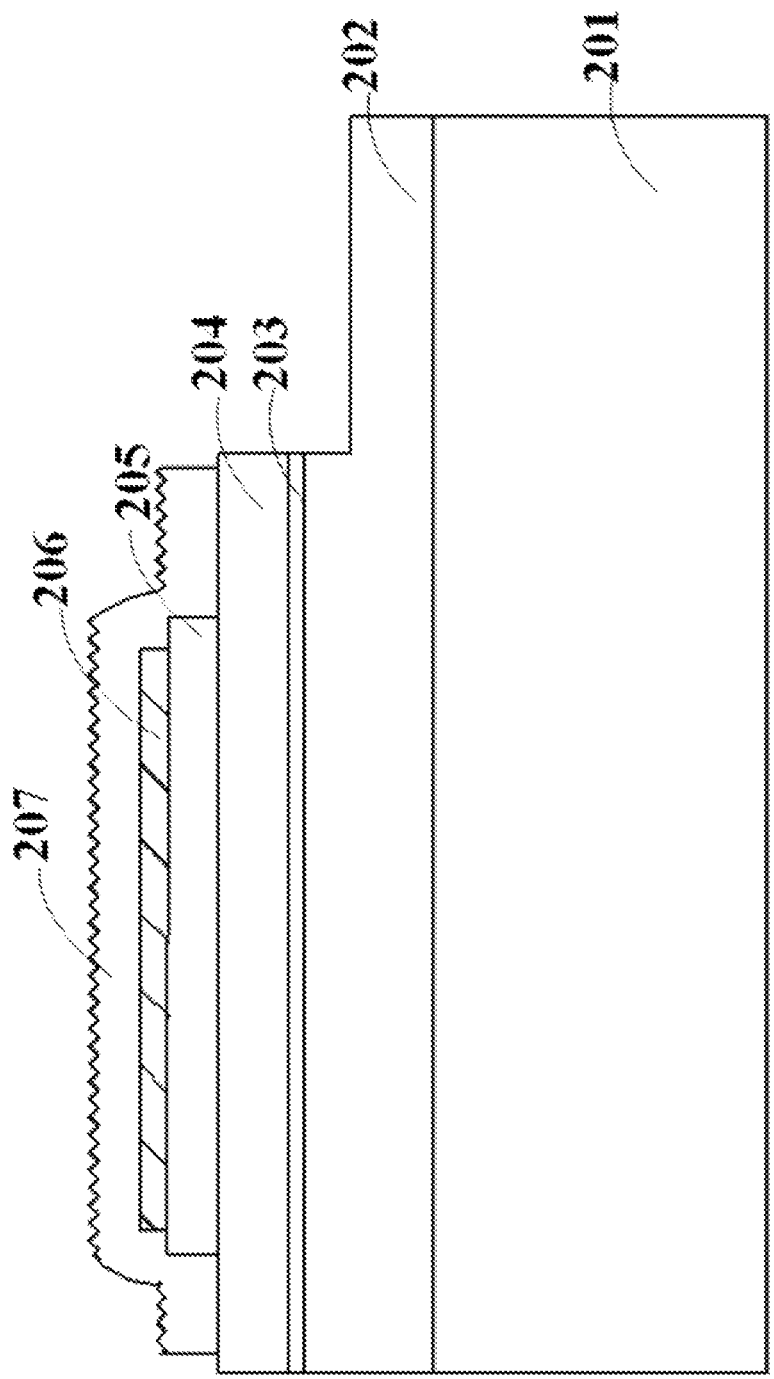
FIG. 10 illustrates a fourth step.
Figure 11:
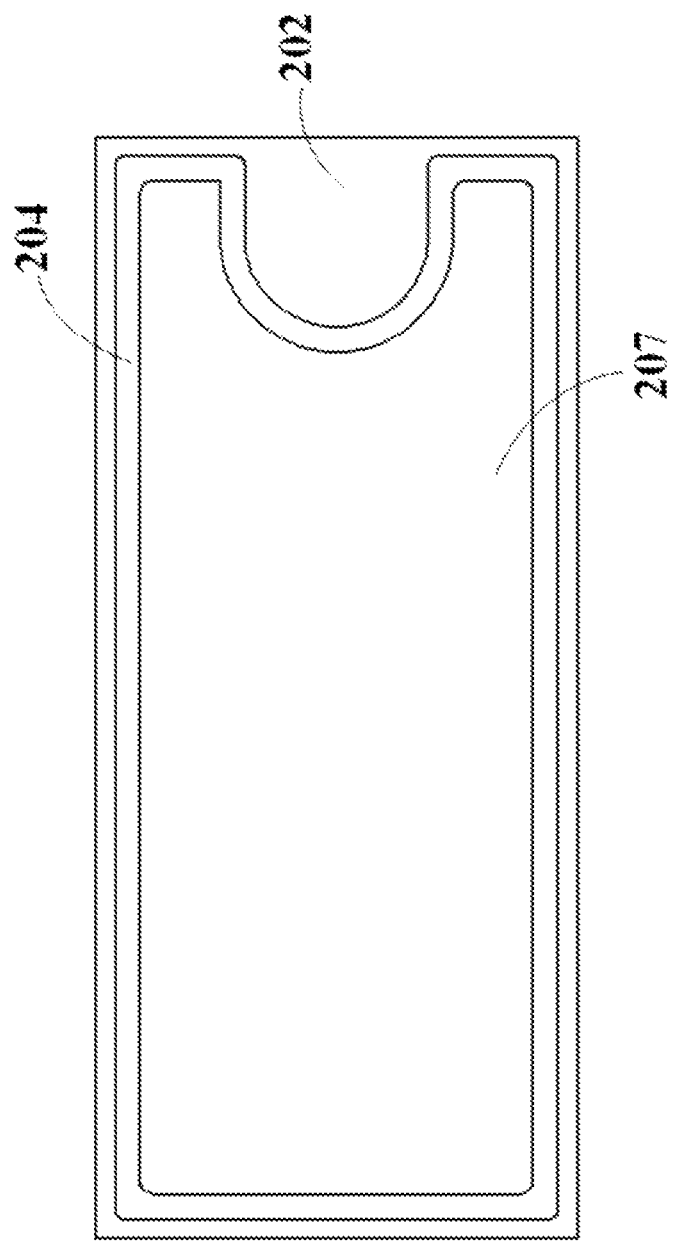
FIG. 11 illustrates a fifth step.

As shown in FIGS. 10 and 11, form a second ITO transparent conducting layer 207 about 300-5000 Å thick over the first ITO transparent conducting layer 206 via evaporating deposition. The first transparent conducting layer 206 obtained from magnetron sputtering has a smooth upper surface. For the second transparent conducting layer 207 obtained from evaporating deposition, part of regions (i.e., the second transparent conducting layer in the non-light-emitting region) cladded over the first transparent conducting layer 206 is rough and the remaining region (i.e., the second transparent conducting layer in the light-emitting region) cladded over the second confinement layer 204 is also rough. The second transparent conducting layer 207 with a rough upper surface is right below the P electrode and has a direct contact with the P electrode, thus increasing adhesiveness of the electrode to the semi-conductor layer and improving reliability of the light emitting diode. The single-layer second transparent conducting layer is over the epitaxial layer, thus guaranteeing current spreading performance, reducing LED chip voltage and preventing forming a large-area and thick transparent conducting layer that may cause more light absorption and light loss.

As shown in FIG. 12, take annealing heat treatment at 200-400° C.; form a P electrode 208 over the second transparent conducting layer 207 via evaporating or sputtering; form an N electrode 209 over the exposed second confinement layer 204 via evaporating or sputtering, in which, the P electrode 208 and the N electrode 209 can be formed via same yellow-light photo masking or lifting-off to complete fabrication of a light emitting diode with dual-layer transparent conducting layer.

In the light emitting diode chips disclosed in the aforesaid embodiments, on the one hand, right below the P electrode is a dual-layer transparent conducting layer structure, and in the dual-layer transparent conducting layer structure, at least one layer adopts evaporating coating which only requires certain roughness without special adjustment of coating parameters (in general, in the industry, to consider photoelectric parameter, the evaporated ITO is dense), thus maximizing stress release between film layers and guaranteeing adhesiveness of the dual-layer transparent conducting layer and the metal electrode. On the other hand, only above the current blocking layer has a dual-layer transparent conducting layer structure, and the dual-layer transparent conducting layer is only located under the P electrode, while most regions above the light-emitting epitaxial layer are single-layer transparent conducting layers, thus guaranteeing current spreading performance, reducing LED chip voltage and preventing forming a large-area and thick transparent conducting layer that may cause more light absorption and light loss.

In comparison to conventional structure, in the light emitting diode fabrication process disclosed in the above two embodiments, only one coating process for the first transparent conducting layer is added, which shares yellow-light photo masking with the current blocking layer, and therefore reduces cost.

Advantages of one or more of the embodiments disclosed herein may include: right below the P electrode is a transparent conducting layer, which is a dual-layer transparent conducting layer structure with a rough surface and has a direct contact with the P electrode, and most of other regions above the light-emitting epitaxial layer are single-layer transparent conducting layers, thus guaranteeing current spreading performance, reducing LED chip voltage and preventing forming a large-area and thick transparent conducting layer that may cause more light absorption and less light effect.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting diode comprising: a substrate; a light-emitting epitaxial layer from bottom to up including semiconductor material layers of a first confinement layer, a light-emitting layer, and a second confinement layer over the substrate; a current blocking layer over a portion of the light-emitting epitaxial layer; a transparent conducting structure over the current blocking layer that extends to the light-emitting epitaxial layer surface and includes a light-emitting region and a non-light-emitting region, in which, the non-light-emitting region corresponds to the current blocking layer with a thickness larger than that of the light-emitting region, thereby ensuring current spreading performance and reducing working voltage and light absorption; and a P electrode over the non-light-emitting region of the transparent conducting structure, wherein the transparent conducting structure comprises: a first transparent conducting layer, with a pattern corresponding to that of the current blocking layer, formed over the current blocking layer; and a second transparent conducting layer that clads over the first transparent conducting layer and the current blocking layer and extends to the light-emitting epitaxial layer surface, in which, a lower surface area of the second transparent conducting layer is larger than an upper surface area of the current blocking layer.

2. The light emitting diode of claim 1, wherein a contact surface between the second transparent conducting layer and the P electrode is a rough surface.

3. The light emitting diode of claim 1, wherein the first transparent conducting layer is about 300-5000 Å thick.

4. The light emitting diode of claim 1, wherein the second transparent conducting layer is about 300-5000 Å thick.

5. A method of fabricating a light emitting diode, comprising:

1) providing a substrate, over which, forming a light-emitting epitaxial layer through epitaxial growth, deposited with a first confinement layer, a light-emitting layer, and a second confinement layer from bottom to up;

2) forming a current blocking layer over a portion of the light-emitting epitaxial layer;

3) fabricating a transparent conducting structure over the current blocking layer and extending to the light-emitting epitaxial layer surface, in which, a non-light-emitting region corresponds to the current blocking layer and a light-emitting region is in direct contact with the light-emitting epitaxial layer, and a thickness of the non-light-emitting region is larger than that of the light-emitting region, thereby ensuring current spreading performance and reducing working voltage and light absorption; and 4) fabricating a P electrode over the non-light-emitting region of the transparent conducting structure, wherein Step 3) comprises:

forming a first transparent conducting layer over the current blocking layer;

forming a second transparent conducting layer over the first transparent conducting layer and extending to the light-emitting epitaxial layer surface, thereby forming a transparent conducting structure, in which, the non-light-emitting region comprises a first and a second transparent conducting layer and the light-emitting region does not comprise the first transparent conducting layer.

6. The method of claim 5, wherein the first transparent conducting layer is formed with evaporating deposition, and the second transparent conducting layer is formed with magnetron sputtering, thereby forming a rough structure at the contact surface between the second transparent conducting layer and the P electrode.

7. The method of claim 5, wherein the first transparent conducting layer is formed with magnetron sputtering, and the second transparent conducting layer is formed with evaporating deposition, thereby forming a rough structure at the contact surface between the second transparent conducting layer and the P electrode.

8. The method of claim 5, wherein the first transparent conducting layer is about 300-5000 Å thick.

9. The method of claim 5, wherein the second transparent conducting layer is about 300-5000 Å thick.

10. A light-emitting system comprising a plurality of light-emitting diode, each light-emitting diode including: a substrate; a light-emitting epitaxial layer from bottom to up including semiconductor material layers of a first confinement layer, a light-emitting layer, and a second confinement layer over the substrate; a current blocking layer over a portion of the light-emitting epitaxial layer; a transparent conducting structure over the current blocking layer that extends to the light-emitting epitaxial layer surface and includes a light-emitting region and a non-light-emitting region, in which, the non-light-emitting region corresponds to the current blocking layer with a thickness larger than that of the light-emitting region, thereby ensuring current spreading performance and reducing working voltage and light absorption; and a P electrode over the non-light-emitting region of the transparent conducting structure, wherein the transparent conducting structure comprises: a first transparent conducting layer, with a pattern corresponding to that of the current blocking layer, formed over the current blocking layer; and a second transparent conducting layer that clads over the first transparent conducting layer and the current blocking layer and extends to the light-emitting epitaxial layer surface, in which, a lower surface area of the second transparent conducting layer is larger than an upper surface area of the current blocking layer.

11. The system of claim 10, wherein a contact surface between the second transparent conducting layer and the P electrode is a rough surface.

12. The system of claim 10, wherein the first transparent conducting layer is about 300-5000 Å thick.

13. The system of claim 10, wherein the second transparent conducting layer is about 300-5000 Å thick.

* * * * *